United States Patent
Lagler et al.

(10) Patent No.: US 11,874,312 B1
(45) Date of Patent: Jan. 16, 2024

(54) PHASE NOISE MEASUREMENT METHOD AND MEASUREMENT SYSTEM

(71) Applicant: Rohde & Schwarz GmbH & Co. KG, Munich (DE)

(72) Inventors: Andreas Lagler, Munich (DE); Florian Ramian, Munich (DE); Karolin Werthmueller, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 18/057,859

(22) Filed: Nov. 22, 2022

(51) Int. Cl.
*G01R 29/26* (2006.01)
*G01R 31/317* (2006.01)

(52) U.S. Cl.
CPC ....... *G01R 29/26* (2013.01); *G01R 31/31709* (2013.01)

(58) Field of Classification Search
CPC .......................... G01R 29/26; G01R 31/31709
USPC ........................................ 324/613, 612, 600
See application file for complete search history.

(56) References Cited

U.S. PATENT DOCUMENTS

| 7,292,947 B1 * | 11/2007 | Tabatabaei | G01R 29/26 702/191 |
| 10,432,325 B1 | 10/2019 | Slamani et al. | |
| 11,424,841 B1 | 8/2022 | Mohindra | |
| 2006/0209942 A1 * | 9/2006 | Onuma | G01R 29/26 375/376 |
| 2010/0148751 A1 * | 6/2010 | Okayasu | G01R 29/26 324/76.52 |

\* cited by examiner

*Primary Examiner* — Giovanni Astacio-Oquendo
(74) *Attorney, Agent, or Firm* — CHRISTENSEN O'CONNOR JOHNSON KINDNESS PLLC

(57) ABSTRACT

A phase noise measurement method of measuring phase noise of a device under test is described. The phase noise measurement method includes the steps of: determining, by a measurement circuit, measurement IQ data based on an output signal of a device under test; setting, by a control circuit, a magnitude threshold; determining, by an analysis circuit, critical samples of reference IQ data for which a magnitude of a reference signal is smaller than the magnitude threshold; discarding the critical samples of the reference IQ data and corresponding critical samples of the measurement IQ data, thereby obtaining modified reference IQ data and modified measurement IQ data; and determining, by the analysis circuit, a phase noise spectrum of the output signal of the device under test based on the modified reference IQ data and based on the modified measurement IQ data. Further, a measurement system is described.

20 Claims, 4 Drawing Sheets

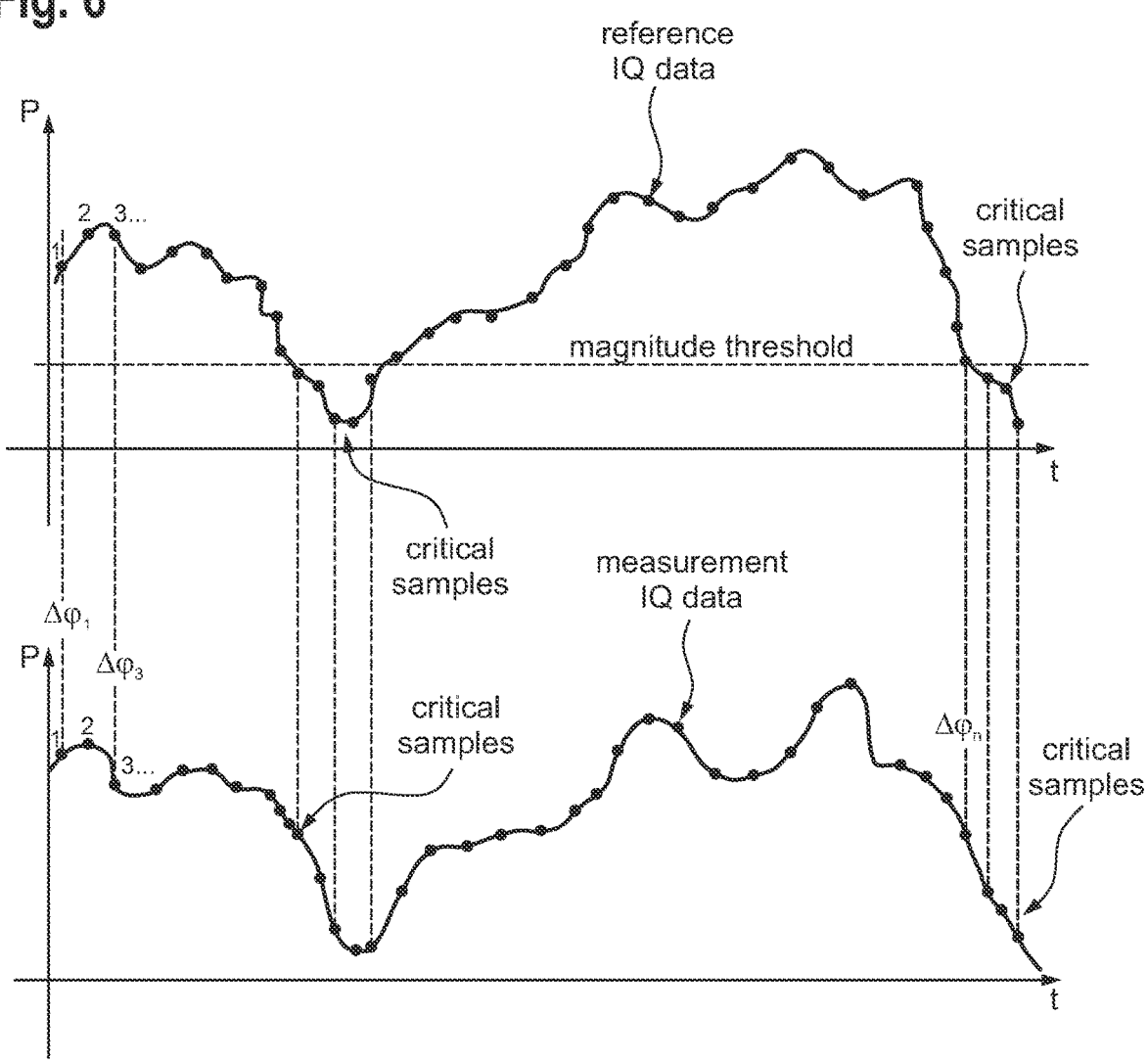

PHASE NOISE MEASUREMENT METHOD AND MEASUREMENT SYSTEM

FIELD OF THE DISCLOSURE

Embodiments of the present disclosure generally relate to a phase noise measurement method of measuring phase noise of a device under test. Embodiments of the present disclosure further relate to a measurement system.

BACKGROUND

In the state of the art, methods for measuring the phase noise of output signals of a device under test are known, wherein the output signal usually corresponds to an unmodulated continuous wave (CW) carrier.

However, it has turned out that the accuracy of the known methods may be reduced considerably if the phase noise of a signal having a modulated carrier is measured.

Thus, there is a need for a phase noise measurement method and a measurement system that allow for a more precise measurement of phase noise for signals having modulated carriers.

SUMMARY

Embodiments of the present disclosure provide a phase noise measurement method of measuring phase noise of a device under test. In an embodiment, the phase noise measurement method comprises the steps of:
  providing reference IQ data, wherein the reference IQ data is associated with a reference signal;
  generating, by a signal generator circuit, the reference signal based on the reference IQ data;
  processing, by the device under test, the reference signal, thereby obtaining an output signal of the device under test;
  determining, by a measurement circuit, measurement IQ data based on the output signal of the device under test;
  setting, by a control circuit, a magnitude threshold;
  determining, by an analysis circuit, critical samples of the reference IQ data for which a magnitude of the reference signal is smaller than the magnitude threshold;
  discarding the critical samples of the reference IQ data and corresponding critical samples of the measurement IQ data, thereby obtaining modified reference IQ data and modified measurement IQ data; and
  determining, by the analysis circuit, a phase noise spectrum of the output signal of the device under test based on the modified reference IQ data and based on the modified measurement IQ data.

The phase noise measurement method according to embodiments of the present disclosure is based on the finding that the critical samples mentioned above are mainly responsible for the degradation of the measurement results of the phase noise, for example if the device under test is a modulated signal.

In general, phase noise measurements of IQ waveforms are meaningful if the wide-band signal-to-noise ratio (SNR) is sufficiently high. In this case, half of the wide-band noise translates into an additional phase noise contribution, so the wide-band noise power spectrum density is a lower bound of the phase noise power spectrum density.

For modulated signal waveforms with varying magnitude, this is no longer the case, because the local SNR is smaller for samples with lower instantaneous magnitude, such that no meaningful measurement of the phase noise spectrum can be performed for portions of the output signal having a low local SNR.

By setting the magnitude threshold and discarding the critical samples with magnitude below the threshold, these portions of the output signal discarded, i.e. not considered for determining the phase noise spectrum.

In other words, with the phase noise measurement methods disclosed herein, only certain portions of the output signal of the device under test are considered for determining the phase noise spectrum, namely portions that have a high enough local SNR in order to allow for meaningful measurements of the phase noise spectrum.

According to the present disclosure, the reference IQ data may be assumed to be free of noise, for example free of phase noise.

When processing the reference signal, the device under test adds phase noise and/or additive white Gaussian noise (AWGN) to the reference signal. Accordingly, the output signal comprises phase noise and/or AWGN, which can be measured by the method(s) according to the present disclosure.

According to an aspect of the present disclosure, the magnitude threshold is, for example, adaptable by a user interface. For example, a user may input the magnitude threshold manually by the user interface, and the control circuit may control the analysis circuit to set the magnitude threshold input by the user.

As another example, the user interface may allow the user to choose an auto-mode, e.g. by pressing a corresponding button. In the auto-mode, the control circuit may automatically determine an appropriate magnitude threshold, as will be described in more detail hereinafter.

In an embodiment of the present disclosure, the magnitude threshold is determined automatically based on the measurement IQ data and/or based on the reference IQ data.

For example, an error vector magnitude (EVM) of the output signal may be determined by the analysis circuit or by the measurement circuit, and the control circuit may set the magnitude threshold to be equal to the EVM. In general, the EVM corresponds to an upper bound of the wide-band noise power. Thus, setting the magnitude threshold to be equal to the EVM ensures that the magnitude of all samples used for determining the phase noise spectrum is above the wide-band noise power, such that meaningful measurements of the phase noise spectrum can be performed.

Alternatively, the magnitude threshold may be set to be equal to a fraction of the EVM, e.g. 75% of the EVM, 50% of the EVM, 25% of the EVM or 10% of the EVM. However, it is to be understood that any other suitable value of the magnitude threshold may be set.

According to another aspect of the present disclosure, the measurement IQ data and the reference IQ data are, for example, time-aligned by the analysis circuit in order to determine the critical samples of the measurement IQ data. By time-aligning the reference IQ data with the measurement IQ data, samples of the measurement IQ data corresponding to samples of the reference IQ data can be identified. Thus, the critical samples of the measurement IQ data correspond to the samples having the same time index (after time-alignment) as the critical samples of the reference IQ data.

In a further embodiment of the present disclosure, the measurement IQ data and the reference IQ data are cross-correlated in order to time-align the measurement IQ data and the reference IQ data. If the measurement IQ data and the reference IQ data are perfectly time-aligned, the value of the cross-correlation reaches its maximum. Accordingly, the measurement IQ data and/or the reference IQ data may be time-shifted until the cross-correlation reaches a (global) maximum, such that the measurement IQ data and the reference IQ data are time-aligned.

A further aspect of the present disclosure provides, for example, that a sample-wise phase difference between the modified measurement IQ data and the modified reference IQ data is determined in order to determine the phase noise spectrum of the output signal. In other words, phase differences between samples of the modified measurement IQ data and samples of the modified reference IQ data corresponding to the same signal portion are determined. Thus, it is ensured that portions of the modified measurement IQ data and of the modified reference IQ data corresponding to each other are considered for determining the phase noise spectrum of the output signal.

In some embodiments, the measurement IQ data and the reference IQ data may be time-aligned in order to determine the sample-wise phase difference between the modified measurement IQ data and the modified reference IQ data.

In some embodiments, the phase noise spectrum of the output signal is determined by a power spectrum density estimation algorithm for non-uniformly sampled signals. In general, due to discarding the critical samples, the resulting modified measurement IQ data corresponds to a non-uniformly sampled signal, as time intervals between consecutive samples of the modified measurement IQ data may vary. The same holds for the modified reference IQ data. Thus, by using the power spectrum density estimation algorithm for non-uniformly sampled signals, the accuracy of the determined phase noise spectrum is enhanced.

According to an aspect of the present disclosure, the modified measurement IQ data is, for example, interpolated in order to determine the phase noise spectrum of the output signal. In other words, samples of the measurement IQ data that have been discarded may be reconstructed by interpolating the modified measurement IQ data, for example by any suitable interpolation technique. This way, the accuracy of the determined phase noise spectrum may be further enhanced.

Likewise, the modified reference IQ data may be interpolated in order to determine the phase noise spectrum of the output signal.

In an embodiment of the present disclosure, the device under test comprises the signal generator circuit. In other words, the device under test may receive the reference IQ data and may generate the output signal based on the reference IQ data.

In some embodiments, the signal generator circuit may be one source of the phase noise and/or of the AWGN added to the reference signal.

Embodiments of the present disclosure further provide a phase noise measurement method of measuring phase noise of a device under test. In an embodiment, the phase noise measurement method comprises the steps of:
  providing reference IQ data, wherein the reference IQ data is associated with a reference signal;
  generating, by a signal generator circuit, the reference signal based on the reference IQ data;
  processing, by the device under test, the reference signal, thereby obtaining an output signal of the device under test, wherein the output signal comprises at least one repeating waveform;
  determining, by a measurement circuit, measurement IQ data based on the output signal of the device under test;
  performing, by the measurement circuit, a sample-wise coherent average of multiple repetitions of the at least one repeating waveform, thereby obtaining averaged measurement IQ data;
  setting, by a control circuit, a magnitude threshold;
  determining, by an analysis circuit, critical samples of the averaged measurement IQ data having a magnitude smaller than the magnitude threshold;
  discarding the critical samples of the averaged measurement IQ data and corresponding critical samples of the measurement IQ data, thereby obtaining modified averaged measurement IQ data and modified measurement IQ data; and
  determining, by the analysis circuit, a phase noise spectrum of the output signal of the device under test based on the modified averaged measurement IQ data and based on the modified measurement IQ data.

In other words, instead of the reference IQ data described above, the averaged measurement IQ data is used by the analysis circuit in order to determine the phase noise spectrum.

Therein, portions of the measurement IQ data and of the averaged measurement IQ data comprising the repeating waveform may be used in order to determine the phase noise spectrum.

The other properties and advantages of the phase noise measurement method described above likewise apply, with the reference IQ data replaced with the averaged measurement IQ data where appropriate.

According to an aspect of the present disclosure, the device under test comprises, for example, the signal generator circuit. In other words, the device under test may receive the reference IQ data and may generate the output signal based on the reference IQ data.

According to another aspect of the present disclosure, the magnitude threshold is, for example, adaptable by a user interface. For example, a user may input the magnitude threshold manually by the user interface, and the control circuit may control the analysis circuit to set the magnitude threshold input by the user.

As another example, the user interface may allow the user to choose an auto-mode, e.g. by pressing a corresponding button. In the auto-mode, the control circuit may automatically determine an appropriate magnitude threshold.

The magnitude threshold may be determined automatically based on the measurement IQ data and/or based on the averaged measurement IQ data. For example, the magnitude threshold may be determined based on an EVM of the output signal, as described above.

In an embodiment of the present disclosure, a sample-wise phase difference between the modified measurement IQ data and the modified averaged measurement IQ data is determined in order to determine the phase noise spectrum of the output signal. In other words, phase differences between samples of the modified measurement IQ data and samples of the modified averaged measurement IQ data corresponding to the same signal portion are determined. Thus, it is ensured that portions of the modified measurement IQ data and of the modified averaged measurement IQ data corresponding to each other are considered for determining the phase noise spectrum of the output signal.

In some embodiments, the measurement IQ data and the averaged measurement IQ data may be time-aligned in order to determine the sample-wise phase difference between the modified measurement IQ data and the modified reference IQ data.

A further aspect of the present disclosure provides that the measurement IQ data is, for example, auto-correlated in order to identify the at least one repeating waveform. Portions of the measurement IQ data comprising repeating waveform correspond to portions of the measurement IQ data with an enhanced value of the auto-correlation. Conversely, the portions of the measurement IQ data comprising repeating waveform can be identified based on the auto-correlation of the measurement IQ data.

Embodiments of the present disclosure further provide a measurement system comprising a measurement instrument. The measurement instrument comprises at least one signal input, a measurement circuit, a control circuit, and an analysis circuit. The at least one signal input is configured to receive an output signal of a device under test. The measurement circuit is configured to determine measurement IQ data based on the output signal of the device under test. The control circuit is configured to set a magnitude threshold. The analysis circuit is configured to determine critical samples of reference IQ data for which a magnitude of a reference signal is smaller than the magnitude threshold. The analysis circuit is configured to discard the critical samples of the reference IQ data and corresponding critical samples of the measurement IQ data, thereby obtaining modified reference IQ data and modified measurement IQ data. The analysis circuit is configured to determine a phase noise spectrum of the output signal of the device under test based on the modified reference IQ data and based on the modified measurement IQ data.

In some embodiments, the measurement system is configured to perform any phase noise measurement method described above.

For example, the measurement instrument is established as a (digital) oscilloscope, as a signal analyzer, as a vector network analyzer, or as a spectrum analyzer.

Regarding the further advantages and properties of the measurement system, reference is made to the explanations given above with respect to the phase measurement method(s) described above, which also hold for the measurement system and vice versa.

An aspect of the present disclosure provides that the measurement instrument, for example, comprises a user interface, wherein the magnitude threshold is adaptable by a user interface. For example, a user may input the magnitude threshold manually by the user interface, and the control circuit may control the analysis circuit to set the magnitude threshold input by the user.

As another example, the user interface may allow the user to choose an auto-mode, e.g. by pressing a corresponding button. In the auto-mode, the control circuit may automatically determine an appropriate magnitude threshold.

In an embodiment of the present disclosure, the control circuit is configured to automatically determine the magnitude threshold based on the measurement IQ data and/or based on the reference IQ data. For example, the control circuit may be configured to determine the magnitude threshold based on an EVM of the output signal, as described above.

The at least one signal input may comprise a reference signal input, wherein the reference signal input is configured to receive the reference IQ data.

In some embodiments, the analysis circuit is configured to determine a sample-wise phase difference between the modified measurement IQ data and the modified reference IQ data in order to determine the phase noise spectrum of the output signal. In other words, phase differences between samples of the modified measurement IQ data and samples of the modified reference IQ data corresponding to the same signal portion are determined. Thus, it is ensured that portions of the modified measurement IQ data and of the modified reference IQ data corresponding to each other are considered for determining the phase noise spectrum of the output signal.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 6 a diagram of a reference signal and of a measurement signal plotted against time.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
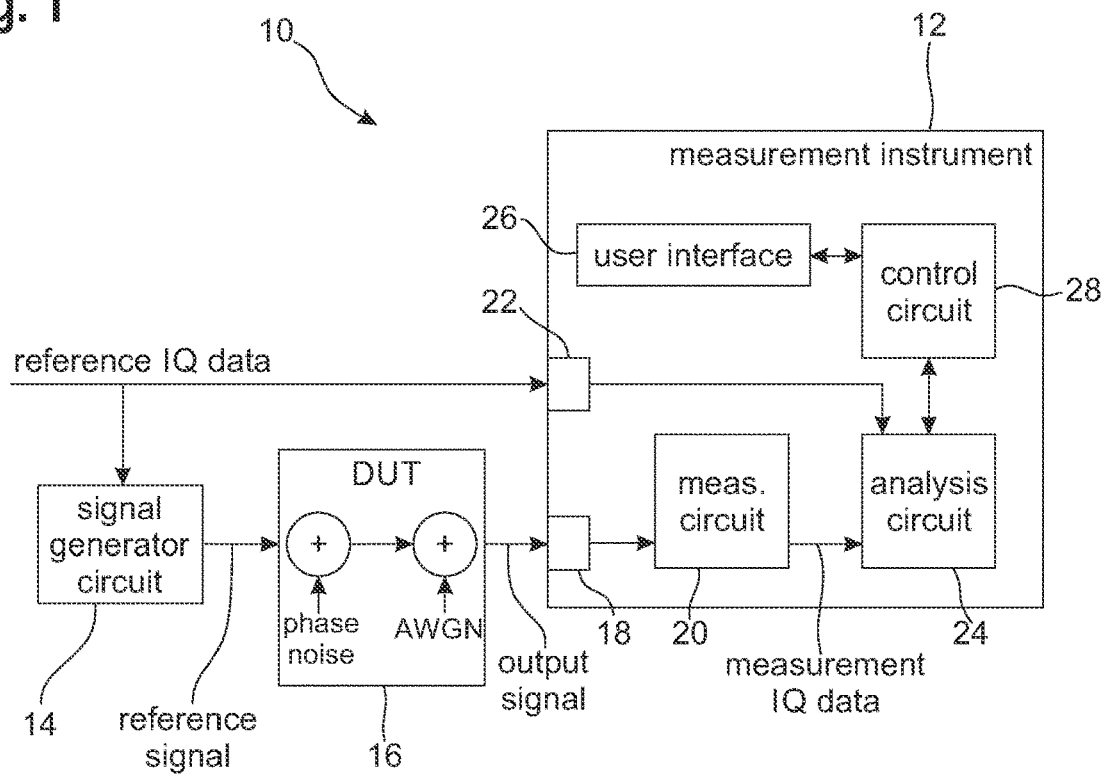
FIG. 1 schematically shows a measurement system according to an embodiment of the present disclosure.

FIG. 1 schematically shows a measurement system 10 comprising a measurement instrument 12, a signal generator circuit 14, and a device under test (DUT) 16. In general, the measurement system 10 or the measurement instrument 12 is configured to determine a phase noise spectrum of the device under test 16.

The measurement instrument 12 may, e.g., be established as a (digital) oscilloscope, as a signal analyzer, as a vector network analyzer, or as a spectrum analyzer. The device under test 16 may be any electronic device that is configured to process and/or generate a reference signal having a modulated carrier.

In the embodiment shown in FIG. 1, the signal generator circuit 14 is established as a standalone signal generator, i.e. the signal generator circuit 14 is established separately from the measurement instrument 12. However, it is also conceivable that the signal generator circuit 14 may be integrated into the measurement instrument 12, i.e. the measurement instrument 12 may comprise the signal generator circuit 14.

The measurement instrument 12 comprises a signal input 18 and a measurement circuit 20 that is connected to the signal input 18 downstream of the signal input 18. Moreover, the measurement instrument 12 comprises a reference signal input 22. The measurement instrument 12 further comprises an analysis circuit 24 that is connected to the measurement circuit 20 downstream of the measurement circuit 20. The analysis circuit 24 is connected to the reference signal input 22 downstream of the reference signal input 22. The measurement instrument 12 further comprises a user interface 26 and a control circuit 28, wherein the control circuit 28 is connected to the user interface 26 and to the analysis circuit 24 in a signal-transmitting manner.

Figure 2:
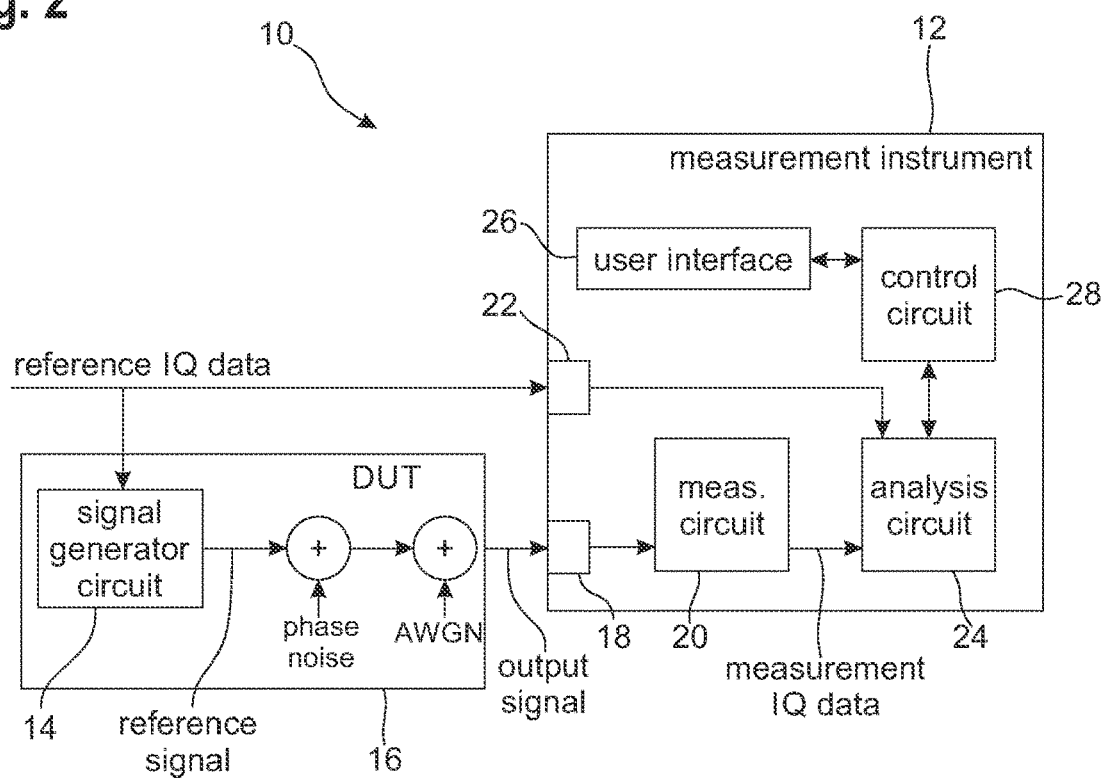
FIG. 2 schematically shows a measurement system according to another embodiment of the present disclosure.

FIG. 2 illustrates another embodiment of the measurement system 10, wherein like reference numerals indicate components with like functionality. In the following, only the differences compared to the embodiment explained above with respect to FIG. 1 are described.

In the embodiment shown in FIG. 2, the device under test 16 comprises the signal generator circuit 14, i.e. the signal generator circuit 14 is integrated into the device under test 16.

Figure 3:
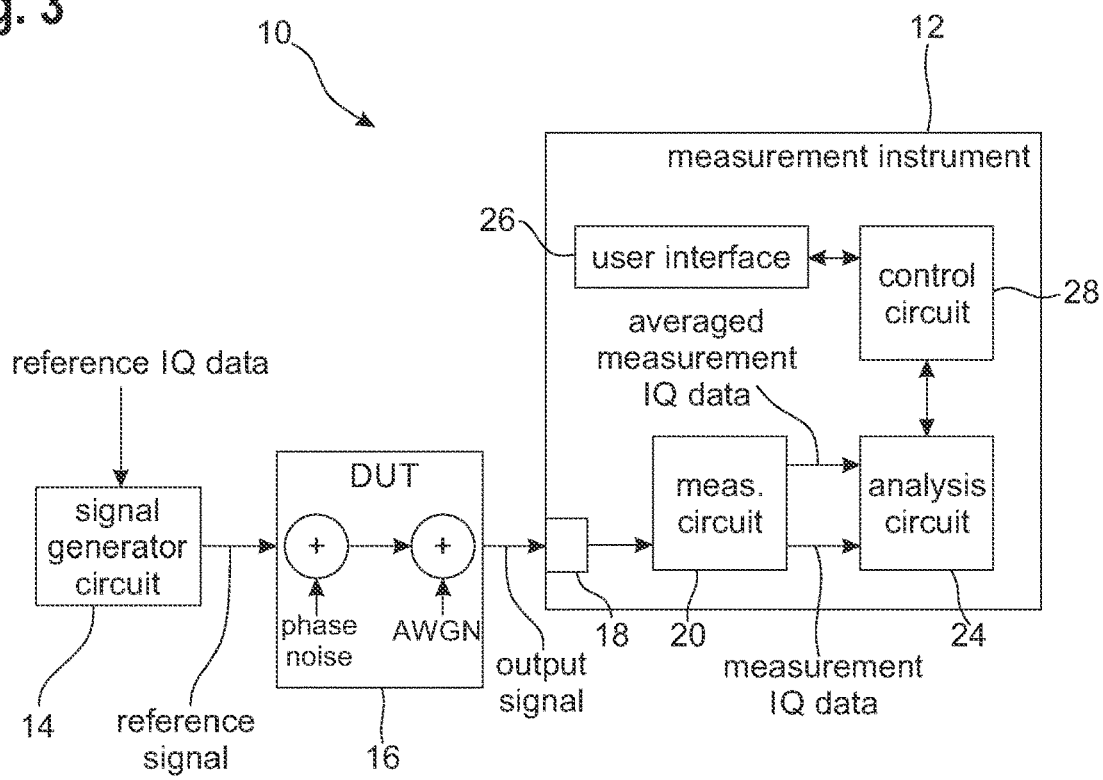
FIG. 3 schematically shows a measurement system according to another embodiment of the present disclosure.

FIG. 3 shows another embodiment of the measurement system 10, wherein like reference numerals indicate components with like functionality. In the following, only the differences compared to the embodiment of FIG. 1 are described.

In the embodiment shown in FIG. 3, the analysis circuit 24 is not connected with the reference signal input 22 as described above with respect to FIG. 1.

In some embodiments, the measurement instrument 12 may, but does not have to comprise, the reference signal input 22.

Figure 4:
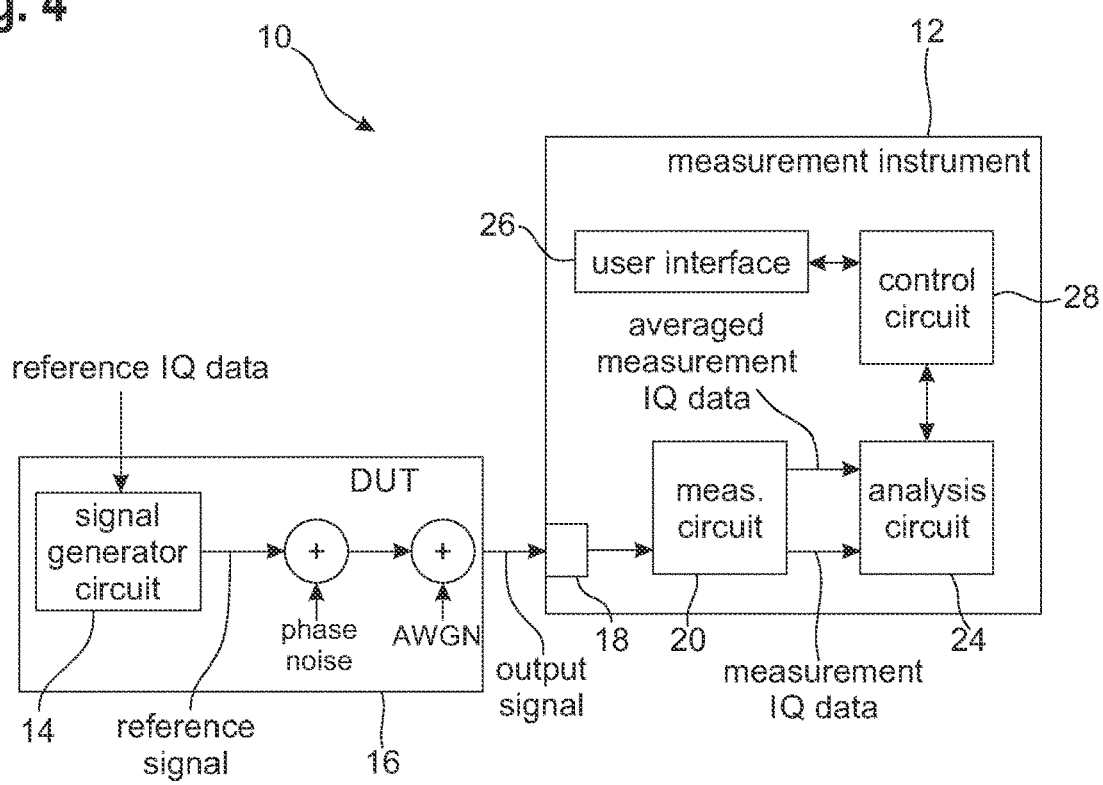
FIG. 4 schematically shows a measurement system according to another embodiment of the present disclosure.

FIG. 4 illustrates another embodiment of the measurement system 10, wherein like reference numerals indicate components with like functionality. In the following, only the differences compared to the embodiment of FIG. 2 are described.

In the embodiment shown in FIG. 4, the analysis circuit 24 is not connected with the reference signal input 22 as described above with respect to FIG. 2.

In some embodiments, the measurement instrument 12 may, but does not have to comprise, the reference signal input 22.

Regardless of the particular embodiment, the measurement system 10 is configured to perform a phase noise measurement method of measuring phase noise of the device under test 16.

Figure 5:
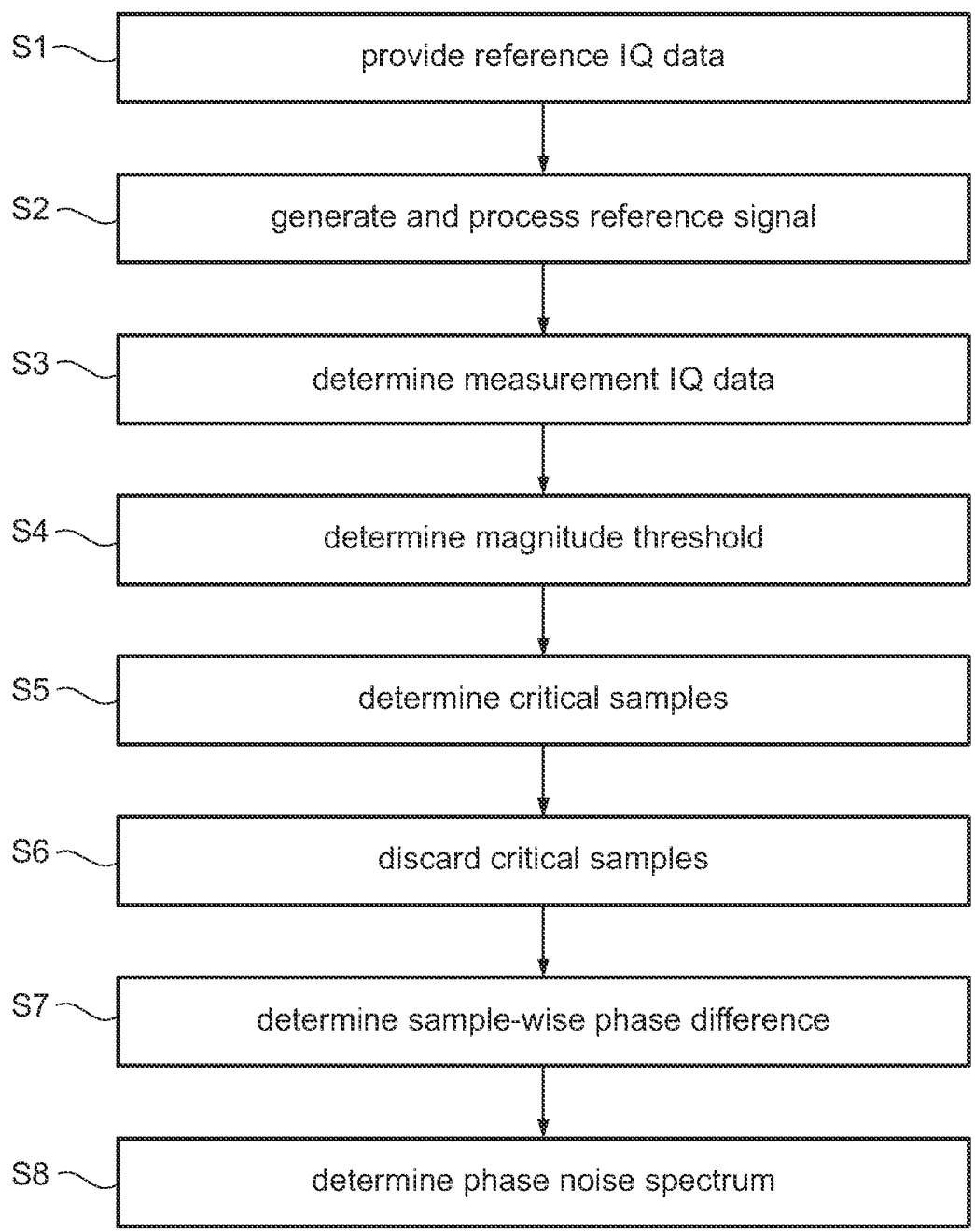
FIG. 5 shows a flow chart of a phase noise measurement method according to an embodiment of the present disclosure.

An embodiment of the phase noise measurement method is described in the following with reference to FIG. 5 as well to FIGS. 1 and 2.

Reference IQ data is provided, wherein the reference IQ data is associated with a reference signal (step S1).

The reference IQ data may be provided by an external computer device controlling the measurement system 10, e.g. by a personal computer, a laptop, a notebook, a smartphone, or another suitable type of smart device. Alternatively, the reference IQ data may be provided by the measurement instrument 12, for example by the control circuit 28.

In the following, it is assumed without restriction of generality that the reference IQ data is received from an external computer device.

The reference IQ data is forwarded to the signal generator circuit 14. Further, the reference IQ signal is forwarded to the analysis circuit 24 via the reference signal input 22.

Therein and in the following, the reference IQ data is assumed to be free of phase noise and additive white Gaussian noise (AWGN). Further, it is assumed that the reference IQ data corresponds to a modulated signal, wherein the signal may be modulated in an arbitrary manner, e.g. via a IQ modulation technique.

A reference signal is generated by the signal generator circuit 14 based on the reference IQ data, and the reference signal is processed by the device under test 16, thereby obtaining an output signal of the device under test 16 (step S2).

In case of the embodiment shown in FIG. 1, the reference signal is generated by the external signal generator circuit 14. The reference signal is then forwarded to and processed by the device under test 16. In case of the embodiment shown in FIG. 2, the reference signal is generated by the signal generator circuit 14 integrated into the device under test 16. The reference signal is then internally processed by the device under test 16. In general, the device under test 16 may process the reference signal in an arbitrary manner, e.g. by filtering, amplifying, attenuating, and/or delaying the reference signal.

Therein, the components of the device under test 16 may add phase noise and/or AWGN to the reference signal, such that the output signal of the device under test 16 comprises phase noise and/or AWGN.

As the reference IQ data corresponds to a modulated signal, the output signal of the device under test 16 is a modulated signal as well. The output signal of the device under test 16 is forwarded to the measurement circuit 20 via the signal input 18.

Measurement IQ data is determined by the measurement circuit 20 based on the output signal of the device under test (step S3). The measurement IQ data comprises in-phase (I) data and quadrature (Q) data associated with the output signal of the device under test 16. Any suitable known technique may be used in order to determine the measurement IQ data.

A magnitude threshold is determined by the control circuit 28, wherein the control circuit 28 controls the analysis circuit 24 to apply the magnitude threshold (step S4). For example, a user may input the magnitude threshold manually by the user interface 26. As another example, the control circuit 28 may determine the magnitude threshold automatically, for example based on the measurement IQ data and/or based on the reference IQ data.

In a particular example, an error vector magnitude (EVM) of the output signal is determined by the measurement circuit 20 or by the analysis circuit 24. The control circuit 28 may determine the magnitude threshold based on the EVM of the output signal. For example, the magnitude threshold may be determined to be a predetermined fraction of the EVM, such as 10% of the EVM, 25% of the EVM, 50% of the EVM, 75% of the EVM, or 100% of the EVM. However, it is to be understood that any other suitable value of the magnitude threshold may be set.

Critical samples of the reference IQ data are determined by the analysis circuit 24 (step S5). As is illustrated in FIG. 6, the critical samples of the reference IQ data correspond to samples for which a magnitude (i.e. a power denoted as "P" in FIG. 6) of the reference signal is smaller than the magnitude threshold.

Critical samples of the reference IQ data and corresponding critical samples of the measurement IQ data are discarded, thereby obtaining modified reference IQ data and modified measurement IQ data (step S6).

As is illustrated in FIG. 6, the critical samples of the measurement IQ data correspond to the samples having the same time index as the critical samples of the reference IQ data after the reference IQ data and the measurement IQ data have been time-aligned.

Therein, it is to be understood that the reference IQ data and the measurement IQ data may be time-aligned before or after the magnitude threshold is set. For example, the measurement IQ data and the reference IQ data are cross-correlated in order to time-align the measurement IQ data and the reference IQ data.

If the measurement IQ data and the reference IQ data are perfectly time-aligned, the value of the cross-correlation reaches its maximum. Accordingly, the measurement IQ data and/or the reference IQ data may be time-shifted until the cross-correlation reaches a (global) maximum.

A sample-wise phase difference between the modified measurement IQ data and the modified reference IQ data is determined, thereby obtaining a set of phase differences ($\Delta\varphi_1, \Delta\varphi_2, \ldots, \Delta\varphi_n$) (step S7). As is illustrated in FIG. 6, the phase differences $\Delta\varphi_i$ are determined for samples of the modified measurement IQ data and the modified reference IQ data having the same time index after time-alignment.

A phase noise spectrum of the output signal of the device under test 16 is determined based on the determined sample-wise phase difference, i.e. based on the set of phase differences ($\Delta\varphi_1, \Delta\varphi_2, \ldots, \Delta\varphi_n$) (step S8). In some embodiments, the phase noise spectrum may be determined based on the set of phase differences ($\Delta\varphi_1, \Delta\varphi_2, \ldots, \Delta\varphi_n$) by a power spectrum density estimation algorithm for non-uniformly sampled signals that is applied to the set of phase differences ($\Delta\varphi_1, \Delta\varphi_2, \ldots, \Delta\varphi_n$).

Therein, the modified measurement IQ data and the modified reference IQ data may be interpolated in order to determine the phase noise spectrum of the output signal. For example, the interpolation may be done by a complementary cumulative distribution function (CCDF) measurement.

The phase noise measurement method described above may be performed by any embodiment of the measurement system 10 of FIG. 1 or 2.

In the following, another embodiment of the phase noise measurement method is described, which can be performed by the measurement system 10 shown in any one of FIGS. 1 to 4. Therein, only the differences compared to the noise measurement method described above are explained in the following.

The reference IQ data provided in step S1 is not forwarded to the analysis circuit 24. In step S2, it is mandatory that the output signal comprises at least one repeating waveform, i.e. a waveform that occurs in the output signal at least twice. Accordingly, the reference IQ data may be configured such that the output signal comprises the at least one repeating waveform.

In step S3, the measurement circuit 20 determines (in addition to the measurement IQ data) a sample-wise coherent average of multiple repetitions of the at least one repeating waveform, thereby obtaining averaged measurement IQ data. Therein, the measurement IQ data may be auto-correlated in order to identify the at least one repeating waveform.

In steps S4 to S8, only samples of the measurement IQ data and of the averaged measurement IQ data corresponding to the at least one repeating waveform may be used, wherein the averaged measurement IQ data replaces the reference IQ data described above. Thus, in steps S5 and S6, critical samples of the averaged measurement IQ data are determined, and the critical samples of the averaged measurement IQ data and of the measurement IQ data are discarded. In step S7, a sample-wise phase difference between the averaged measurement IQ data and the measurement IQ data is determined in order to determine the phase noise spectrum in step S8.

Certain embodiments disclosed herein utilize circuitry (e.g., one or more circuits), such as but not limited to the signal generator circuit 14, the measurement circuit 20, the analysis circuit 24, the control circuit 28, etc., in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

For example, in some embodiments the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

In some embodiments, the one or more computer-readable media contains computer readable instructions embodied thereon that, when executed by the one or more computer circuits, sometimes referred to as computing devices, cause the one or more computer circuits to perform one or more steps of any of the methods of the claimed subject matter.

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A phase noise measurement method of measuring phase noise of a device under test, the phase noise measurement method comprising the steps of:
   providing reference IQ data, wherein the reference IQ data is associated with a reference signal;
   generating, by a signal generator circuit, the reference signal based on the reference IQ data;

processing, by the device under test, the reference signal, thereby obtaining an output signal of the device under test;

determining, by a measurement circuit, measurement IQ data based on the output signal of the device under test;

setting, by a control circuit, a magnitude threshold;

determining, by an analysis circuit, critical samples of the reference IQ data for which a magnitude of the reference signal is smaller than the magnitude threshold;

discarding the critical samples of the reference IQ data and corresponding critical samples of the measurement IQ data, thereby obtaining modified reference IQ data and modified measurement IQ data; and determining, by the analysis circuit, a phase noise spectrum of the output signal of the device under test based on the modified reference IQ data and based on the modified measurement IQ data.

2. The phase noise measurement method of claim 1, wherein the magnitude threshold is adaptable by a user interface.

3. The phase noise measurement method of claim 1, wherein the magnitude threshold is determined automatically based on the measurement IQ data and/or based on the reference IQ data.

4. The phase noise measurement method of claim 1, wherein the measurement IQ data and the reference IQ data are time-aligned by the analysis circuit in order to determine the critical samples of the measurement IQ data.

5. The phase noise measurement method of claim 4, wherein the measurement IQ data and the reference IQ data are cross-correlated in order to time-align the measurement IQ data and the reference IQ data.

6. The phase noise measurement method of claim 1, wherein a sample-wise phase difference between the modified measurement IQ data and the modified reference IQ data is determined in order to determine the phase noise spectrum of the output signal.

7. The phase noise measurement method of claim 1, wherein the phase noise spectrum of the output signal is determined by a power spectrum density estimation algorithm for non-uniformly sampled signals.

8. The phase noise measurement method of claim 1, wherein the modified measurement IQ data is interpolated in order to determine the phase noise spectrum of the output signal.

9. The phase noise measurement method of claim 1, wherein the device under test comprises the signal generator circuit.

10. A phase noise measurement method of measuring phase noise of a device under test, the phase noise measurement method comprising the steps of:

providing reference IQ data, wherein the reference IQ data is associated with a reference signal;

generating, by a signal generator circuit, the reference signal based on the reference IQ data;

processing, by the device under test, the reference signal, thereby obtaining an output signal of the device under test, wherein the output signal comprises at least one repeating waveform;

determining, by a measurement circuit, measurement IQ data based on the output signal of the device under test;

performing, by the measurement circuit, a sample-wise coherent average of multiple repetitions of the at least one repeating waveform, thereby obtaining averaged measurement IQ data;

setting, by a control circuit, a magnitude threshold;

determining, by an analysis circuit, critical samples of the averaged measurement IQ data having a magnitude smaller than the magnitude threshold;

discarding the critical samples of the averaged measurement IQ data and corresponding critical samples of the measurement IQ data, thereby obtaining modified averaged measurement IQ data and modified measurement IQ data; and determining, by the analysis circuit, a phase noise spectrum of the output signal of the device under test based on the modified averaged measurement IQ data and based on the modified measurement IQ data.

11. The phase noise measurement method of claim 10, wherein the device under test comprises the signal generator circuit.

12. The phase noise measurement method of claim 10, wherein the magnitude threshold is adaptable by a user interface.

13. The phase noise measurement method of claim 10, wherein the magnitude threshold is determined automatically based on the measurement IQ data and/or based on the averaged measurement IQ data.

14. The phase noise measurement method of claim 10, wherein a sample-wise phase difference between the modified measurement IQ data and the modified averaged measurement IQ data is determined in order to determine the phase noise spectrum of the output signal.

15. The phase-noise measurement method of claim 10, wherein the measurement IQ data is auto-correlated in order to identify the at least one repeating waveform.

16. A measurement system comprising a measurement instrument, the measurement instrument comprising at least one signal input, a measurement circuit, a control circuit, and an analysis circuit, wherein the at least one signal input is configured to receive an output signal of a device under test, wherein the measurement circuit is configured to determine measurement IQ data based on the output signal of the device under test, wherein the control circuit is configured to set a magnitude threshold, wherein the analysis circuit is configured to determine critical samples of reference IQ data for which a magnitude of a reference signal is smaller than the magnitude threshold, wherein the analysis circuit is configured to discard the critical samples of the reference IQ data and corresponding critical samples of the measurement IQ data, thereby obtaining modified reference IQ data and modified measurement IQ data, and wherein the analysis circuit is configured to determine a phase noise spectrum of the output signal of the device under test based on the modified reference IQ data and based on the modified measurement IQ data.

17. The measurement system of claim 16, wherein the measurement instrument comprises a user interface, wherein the magnitude threshold is adaptable by a user interface.

18. The measurement system of claim 16, wherein the control circuit is configured to automatically determine the magnitude threshold based on the measurement IQ data and/or based on the reference IQ data.

19. The measurement system of claim 16, wherein the at least one signal input comprises a reference signal input, and wherein the reference signal input is configured to receive the reference IQ data.

20. The measurement system of claim 16, wherein the analysis circuit is configured to determine a sample-wise phase difference between the modified measurement IQ data and the modified reference IQ data in order to determine the phase noise spectrum of the output signal.

\* \* \* \* \*